United States Patent
Richardson et al.

(10) Patent No.: US 10,419,027 B2
(45) Date of Patent: Sep. 17, 2019

(54) ADJUSTED MIN-SUM DECODER

(71) Applicant: QUALCOMM Incorporated, San Diego, CA (US)

(72) Inventors: Thomas Joseph Richardson, South Orange, NJ (US); Shrinivas Kudekar, Raritan, NJ (US); Vincent Loncke, Piscataway, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 161 days.

(21) Appl. No.: 15/782,807

(22) Filed: Oct. 12, 2017

(65) Prior Publication Data

US 2018/0109269 A1 Apr. 19, 2018

Related U.S. Application Data

(60) Provisional application No. 62/407,768, filed on Oct. 13, 2016.

(51) Int. Cl.
| | | |
|---|---|---|
| *H03M 13/11* | (2006.01) | |
| *H03M 13/00* | (2006.01) | |
| *H04W 24/08* | (2009.01) | |
| *H03M 13/39* | (2006.01) | |

(52) U.S. Cl.
CPC ...... *H03M 13/1154* (2013.01); *H03M 13/112* (2013.01); *H03M 13/1122* (2013.01); *H03M 13/1128* (2013.01); *H03M 13/3911* (2013.01); *H03M 13/618* (2013.01); *H03M 13/6511* (2013.01); *H03M 13/6577* (2013.01); *H03M 13/6583* (2013.01); *H04W 24/08* (2013.01)

(58) Field of Classification Search
CPC ......... H03M 13/1154; H03M 13/6583; H03M 13/6577; H03M 13/6511; H03M 13/3911; H03M 13/1128; H03M 13/112; H03M 13/618; H03M 13/1122; H04W 24/08
See application file for complete search history.

(56) References Cited

U.S. PATENT DOCUMENTS

| | | |
|---|---|---|
| 6,633,865 B1 | 10/2003 | Liao |
| 6,961,888 B2 | 11/2005 | Jin et al. |
| 7,133,853 B2 | 11/2006 | Richardson et al. |

(Continued)

FOREIGN PATENT DOCUMENTS

EP 1819056 A1 8/2007

OTHER PUBLICATIONS

Mackay D.J.C., "Good Error-Correcting Codes Based on Very Sparse Matrices," IEEE Transactions on Information Theory, Mar. 1999, vol. 45 (2), pp. 399-431.

(Continued)

*Primary Examiner* — April Y Blair
*Assistant Examiner* — Rong Tang
(74) *Attorney, Agent, or Firm* — Patterson & Sheridan, LLP

(57) ABSTRACT

Certain aspects of the present disclosure generally relate to techniques for efficient, high-performance decoding of low-density parity check (LDPC) codes, for example, by using an adjusted minimum-sum (AdjMS) algorithm, which involves approximating an update function and determining magnitudes of outgoing log likelihood ratios (LLRs). Similar techniques may also be used for decoding turbo codes. Other aspects, embodiments, and features (such as encoding technique) are also claimed and described.

26 Claims, 7 Drawing Sheets

(56) References Cited

U.S. PATENT DOCUMENTS

| | | | |
|---|---|---|---|
| 7,552,097 | B2 | 6/2009 | Richardson et al. |
| 7,627,801 | B2 | 12/2009 | Jin et al. |
| 8,751,902 | B2 | 6/2014 | Jin et al. |
| 2005/0149844 | A1 | 7/2005 | Tran et al. |

OTHER PUBLICATIONS

Roth C., et al., "A 15.8 pJ/bit/iter Quasi-Cyclic LDPC Decoder for IEEE 802.11n in 90 nm CMOS," IEEE Asian Solid-State Circuits Conference, Nov. 8-10, 2010, 4 pages.

Zhang Z., et al., "An Efficient 10GBASE-T Ethernet LDPC Decoder Design With Low Error Floors," IEEE Journal of Solid-State Circuits, Apr. 2010, vol. 45 (4), pp. 843-855.

Hu X-Y., et al., "Efficient Implementations of the Sum-Product Algorithm for Decoding LDPC Codes", Proc., IEEE Global Telecommunications Conference, GLOBECOM'01, San Antonio, Texas, USA, Nov. 25, 2001-Nov. 29, 2001, pp. 1036-1036E, XP001099262, DOI: 10.1109/GLOCOM.2001.965575, ISBN: 978-0-7803-7206-1.

International Search Report and Written Opinion—PCT/US2017/056617—ISA/EPO—dated Jan. 24, 2018.

Pandya N., et al., "Low-Complexity Decoding of LDPC Codes", Electronics Letters, IEEE Stevenage, GB, vol. 43, No. 18, Aug. 31, 2007, pp. 990-991, XP006029610, ISSN: 0013-5194. DOI: 10.1049/EL:20071653.

Poocharoen P., et al., "Different Perspective and Approach to Implement Adaptive Normalised Belief Propagation-based Decoding for Low-Density Parity Check Codes", IET Communications, The Institution of Engineering and Technology, GB, vol. 6, No. 15, Oct. 16, 2012, pp. 2314-2325, XP006042823, ISSN: 1751-8628, DOI: 10.1049/IET-COM.2011.0792.

Robertson P., et al., "Optimal and Sub-Optimal Maximum a Posteriori Algorithms Suitable for Turbo Decoding", European Transactions on Telecommunications, Wiley & Sons, Chichester, GB, vol. 8, No. 2, Mar. 1, 1997, pp. 119-125, XP000687105, ISSN: 1124-318X.

ADJUSTED MIN-SUM DECODER

CLAIM OF PRIORITY UNDER 35 U.S.C. § 119

This application claims benefit of U.S. Provisional Patent Application Ser. No. 62/407,768, filed Oct. 13, 2016, which is herein incorporated by reference in its entirety as if fully set forth below and for all applicable purposes

TECHNICAL FIELD

Certain aspects of the present disclosure generally relate to methods and apparatus for a wireless communications and, more particularly, to an adjusted minimum-sum decoder for efficient, high performance decoding of LDPC and Turbo codes. Embodiments enable and provide innovative communication components (e.g., wireless transmitters and receivers) that provide high performing LDPC decoders and unified decoders supporting both turbo codes and LDPC codes with high performance.

INTRODUCTION

Wireless communication systems are widely deployed to provide various types of communication content such as voice, data, and so on. These systems may be multiple-access systems capable of supporting communication with multiple users by sharing the available system resources (e.g., bandwidth and transmit power). Examples of such multiple-access systems include Long Term Evolution (LTE) systems, Code Division Multiple Access (CDMA) systems, Time Division Multiple Access (TDMA) systems, Frequency Division Multiple Access (FDMA) systems, $3^{rd}$ Generation Partnership Project (3GPP) Long Term Evolution (LTE) systems, Long Term Evolution Advanced (LTE-A) systems, and Orthogonal Frequency Division Multiple Access (OFDMA) systems.

Generally, a wireless multiple-access communication system can simultaneously support communication for multiple wireless nodes. Each node communicates with one or more base stations via transmissions on forward and reverse links. The forward link (or downlink) refers to a communication link from base stations to nodes, and a reverse link (or uplink) refers to a communication link from nodes to base stations. Communication links may be established via a single-input single-output, multiple-input single-output, or a multiple-input multiple-output (MIMO) system.

In the modern information age, binary values (e.g., ones and zeros), are used to represent and communicate various types of information, such as video, audio, statistical information, etc. Unfortunately, during storage, transmission, and/or processing of binary data, errors may be unintentionally introduced; for example, a one may be changed to a zero or vice versa.

Generally, in the case of data transmission, a receiver observes each received bit in the presence of noise or distortion and only an indication of the bit's value is obtained. Under these circumstances, the observed values are interpreted as a source of "soft" bits. A soft bit indicates a preferred estimate of the bit's value (e.g., a one or a zero) together with some indication of the reliability of that estimate. While the number of errors may be relatively low, even a small number of errors or level of distortion can result in the data being unusable or, in the case of transmission errors, may necessitate retransmission of the data.

In order to provide a mechanism to check for errors and, in some cases, to correct errors, binary data can be coded to introduce carefully designed redundancy. Coding of a unit of data produces what is commonly referred to as a code word. Because of its redundancy, a code word will often include more bits than the input unit of data from which the code word was produced.

Redundant bits are added by an encoder to the transmitted bit stream to create a code word. When signals arising from transmitted code words are received or processed, the redundant information included in the code word as observed in the signal can be used to identify and/or correct errors in or remove distortion from the received signal in order to recover the original data unit. Such error checking and/or correcting can be implemented as part of a decoding process. In the absence of errors, or in the case of correctable errors or distortion, decoding can be used to recover from the source data being processed, the original data unit that was encoded. In the case of unrecoverable errors, the decoding process may produce some indication that the original data cannot be fully recovered. Such indications of decoding failure can be used to initiate retransmission of the data.

With the increased use of fiber optic lines for data communication and increases in the rate at which data can be read from and stored to data storage devices, (e.g., disk drives, tapes, etc.), there is an increasing need not only for efficient use of data storage and transmission capacity but also for the ability to encode and decode data at high rates of speed.

While encoding efficiency and high data rates are important, for an encoding and/or decoding system to be practical for use in a wide range of devices (e.g., consumer devices), it is important that the encoders and/or decoders be capable of being implemented at reasonable cost.

BRIEF SUMMARY

The systems, methods, and devices of the disclosure each have several aspects, no single one of which is solely responsible for its desirable attributes. Without limiting the scope of this disclosure as expressed by the claims, which follow, some features will now be discussed briefly. After considering this discussion, and particularly after reading the section entitled "Detailed Description" one will understand how the features of this disclosure provide advantages that include improved communications between access points and stations in a wireless network.

Communication systems often need to operate at several different rates. One way to keep the implementation as simple as possible and to provide for the coding and decoding at the different rates is to use adjustable low-density-parity check (LDPC) codes. In particular, one can generate higher-rate LDPC codes by puncturing lower-rate codes.

These multiple access technologies have been adopted in various telecommunication standards to provide a common protocol that enables different wireless devices to communicate on a municipal, national, regional, and even global level. An example of an emerging telecommunication standard is new radio (NR). NR is a set of enhancements to the LTE mobile standard (e.g., 5G radio access) promulgated by Third Generation Partnership Project (3GPP). NR is designed to better support mobile broadband Internet access by improving spectral efficiency, lower costs, improve services, make use of new spectrum, and better integrate with other open standards using OFDMA with a cyclic prefix (CP) on the downlink (DL) and on the uplink (UL) as well as support beamforming, multiple-input multiple-output (MIMO) antenna technology, and carrier aggregation.

As the demand for mobile broadband access continues to increase, there exists a need for further improvements in NR technology. Preferably, these improvements should be applicable to other multi-access technologies and the telecommunication standards that employ these technologies. One area for improvements is the area of encoding/decoding, applicable to NR. For example, techniques for high performance LDPC codes for NR are desirable.

Certain aspects of the present disclosure generally relate to techniques for efficient, high-performance decoding of low-density parity check (LDPC) codes, for example, by using an adjusted minimum-sum (AdjMS) algorithm, which involves approximating an update function and determining magnitudes of outgoing log likelihood ratios (LLRs), as described in greater detail below. According to certain aspects, a similar technique allows for a unified decoder for decoding both turbo codes and LDPC codes.

Certain aspects of the present disclosure provide a method for wireless communications. The method generally includes receiving a codeword over a wireless channel, receiving, at a processing node of a decoder used to decode the codeword, a first incoming log likelihood ratio (LLR) and a second incoming LLR associated with the codeword, approximating a processing node function and computing an output of the processing node function based, at least in part, on a magnitude of the first incoming LLR and a magnitude of the second incoming LLR, and decoding the codeword based, at least in part, on the output of the processing node function.

Certain aspects of the present disclosure provide an apparatus for wireless communications. The apparatus generally includes at least one processor configured to receive a codeword over a wireless channel, receive, at a processing node of a decoder used to decode the codeword, a first incoming log likelihood ratio (LLR) and a second incoming LLR associated with the codeword, approximate a processing node function and compute an output of the processing node function based, at least in part, on a magnitude of the first incoming LLR and a magnitude of the second incoming LLR, and decode the codeword based, at least in part, on the output of the processing node function. The apparatus also generally includes a memory coupled with the at least one processor.

Certain aspects of the present disclosure provide an apparatus for wireless communications. The apparatus generally includes means for receiving a codeword over a wireless channel, means for receiving, at a processing node of a decoder used to decode the codeword, a first incoming log likelihood ratio (LLR) and a second incoming LLR associated with the codeword, means for approximating a processing node function and means for computing an output of the processing node function based, at least in part, on a magnitude of the first incoming LLR and a magnitude of the second incoming LLR, and means for decoding the codeword based, at least in part, on the output of the processing node function.

Certain aspects of the present disclosure provide a non-transitory computer-readable medium for wireless communications. The non-transitory computer-readable medium generally includes instructions that, when executed by at least one processor, configure the at least one processor to receive a codeword over a wireless channel, receive, at a processing node of a decoder used to decode the codeword, a first incoming log likelihood ratio (LLR) and a second incoming LLR associated with the codeword, approximate a processing node function and compute an output of the processing node function based, at least in part, on a magnitude of the first incoming LLR and a magnitude of the second incoming LLR, and decode the codeword based, at least in part, on the output of the processing node function.

Other aspects, features, and embodiments of the present invention will become apparent to those of ordinary skill in the art, upon reviewing the following description of specific, exemplary embodiments of the present invention in conjunction with the accompanying figures. While features of the present invention may be discussed relative to certain embodiments and figures below, all embodiments of the present invention can include one or more of the advantageous features discussed herein. In other words, while one or more embodiments may be discussed as having certain advantageous features, one or more of such features may also be used in accordance with the various embodiments of the invention discussed herein. In similar fashion, while exemplary embodiments may be discussed below as device, system, or method embodiments it should be understood that such exemplary embodiments can be implemented in various devices, systems, and methods.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. The appended drawings illustrate only certain typical aspects of this disclosure, however, and are therefore not to be considered limiting of its scope, for the description may admit to other equally effective aspects.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Figure 1:
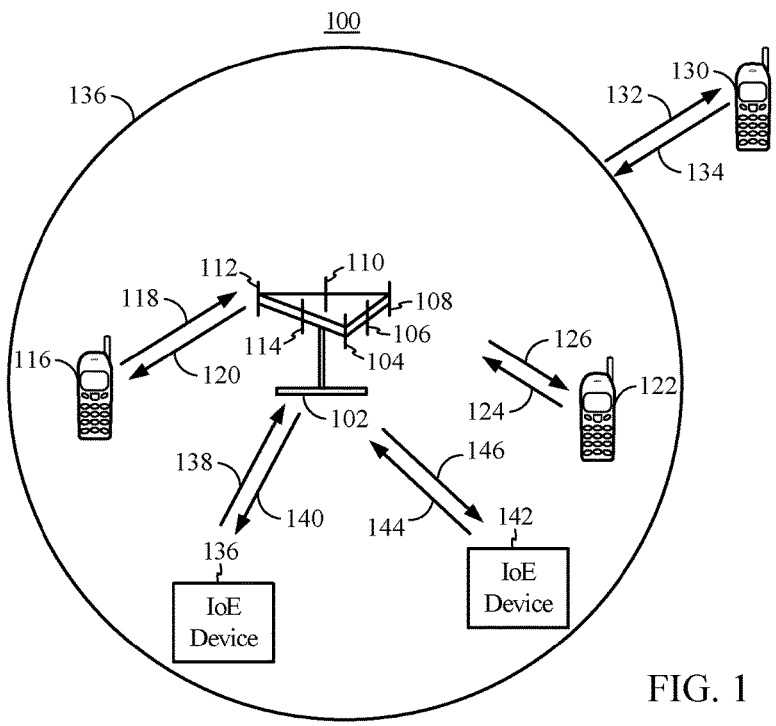
FIG. 1 illustrates an example multiple access wireless communication system, in accordance with certain aspects of the present disclosure.

Aspects of the present disclosure provide apparatus, methods, processing systems, and computer program products for encoding and decoding for 5G (new radio access technology). 5G may refer to radios configured to operate according to a new air interface or fixed transport layer. 5G may include Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and mission critical targeting ultra reliable low latency communications (URLLC). For these general topics, different techniques are considered, such as coding, low-density parity check (LDPC), and polar. A 5G cell may refer to a cell operating according to the new air interface or fixed transport layer. A 5G Node B may correspond to one or multiple transmission reception points (TRPs).

Turbo codes and LDPC codes are both often decoded using message-passing iterative decoders. The BCJR decoder and the Sum-product (SP) decoders are powerful low-complexity decoders. However, the BCJR decoding algorithm for Turbo codes and the SP decoding algorithm for LDPC codes require implementation of certain relatively complex functions and hence are not easily implementable in practice. Many approximations of these decoder are based on simplifications of these operations. Traditional approximation of the BCJR/SP operations result in a lot of complexity savings but come at the cost of degraded performance which is stark at lower rates. Techniques presented herein addresses the challenge of designing new approximations to the BCJR/SP decoding algorithms that retain the complexity savings of the traditional implementable approximations but attain performance very close to the BCJR/SP decoding algorithms for a very wide range of operating points.

For example, certain aspects of the present disclosure generally relate to techniques for efficient, high-performance encoding with and decoding of low-density parity check (LDPC) codes, for example, by using an adjusted minimum-sum (AdjMS) algorithm. According to aspects, techniques presented herein involve approximating an update function, U, and determining magnitudes of outgoing log likelihood ratios (LLRs), as described in greater detail below. According to certain aspects, a similar technique may also be used for decoding turbo codes. Aspects and features discussed below may at times focus on decoding techniques and those of skill in the art will understand that these techniques can also be applied and implemented in encoding implementations and scenarios too.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method, which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc.

Although particular aspects are described herein, many variations and permutations of these aspects fall within the scope of the disclosure. Although some benefits and advantages of the preferred aspects are mentioned, the scope of the disclosure is not intended to be limited to particular benefits, uses, or objectives. Rather, aspects of the disclosure are intended to be broadly applicable to different wireless technologies, system configurations, networks, and transmission protocols, some of which are illustrated by way of example in the figures and in the following description of the preferred aspects. The detailed description and drawings are merely illustrative of the disclosure rather than limiting, the scope of the disclosure being defined by the appended claims and equivalents thereof.

The techniques described herein may be used for various wireless communication networks such as Long Term Evolution (LTE), Code Division Multiple Access (CDMA) networks, Time Division Multiple Access (TDMA) networks, Frequency Division Multiple Access (FDMA) networks, Orthogonal FDMA (OFDMA) networks, Single-Carrier FDMA (SC-FDMA) networks, etc. The terms "networks" and "systems" are often used interchangeably. A CDMA network may implement a radio technology such as Universal Terrestrial Radio Access (UTRA), CDMA2000, etc. UTRA includes Wideband-CDMA (W-CDMA) and Low Chip Rate (LCR). CDMA2000 covers IS-2000, IS-95, and IS-856 standards. A TDMA network may implement a radio technology such as Global System for Mobile Communications (GSM). An OFDMA network may implement a radio technology such as NR (e.g., 5G RA), Evolved UTRA (E-UTRA), IEEE 802.11, IEEE 802.16, IEEE 802.20, Flash- OFDM®, etc. UTRA, E-UTRA, and GSM are part of Universal Mobile Telecommunication System (UMTS). Long Term Evolution (LTE) is a release of UMTS that uses E-UTRA. UTRA, E-UTRA, GSM, UMTS, and LTE are described in documents from an organization named "3rd Generation Partnership Project" (3GPP). CDMA2000 is described in documents from an organization named "3rd Generation Partnership Project 2" (3GPP2). NR is an emerging wireless communications technology under development in conjunction with the 5G Technology Forum (5GTF). These communications networks are merely listed as examples of networks in which the techniques described in this disclosure may be applied; however, this disclosure is not limited to the above-described communications network.

Single carrier frequency division multiple access (SC-FDMA) is a transmission technique that utilizes single carrier modulation at a transmitter side and frequency domain equalization at a receiver side. The SC-FDMA has similar performance and essentially the same overall complexity as those of OFDMA system. However, SC-FDMA signal has lower peak-to-average power ratio (PAPR) because of its inherent single carrier structure. The SC-FDMA has drawn great attention, especially in the uplink (UL) communications where lower PAPR greatly benefits the wireless node in terms of transmit power efficiency.

An access point ("AP") may comprise, be implemented as, or known as NodeB, Radio Network Controller ("RNC"), eNodeB (eNB), Node B (e.g., 5G Node B), transmission reception point (TRP), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or be known as an access terminal, a subscriber station, a subscriber unit, a mobile station, a remote station, a remote terminal, a user terminal, a user agent, a user device, user equipment (UE), a user station, a wireless node, or some other terminology. In some implementations, an access terminal may comprise a cellular telephone, a smart phone, a cordless telephone, a Session Initiation Protocol ("SIP") phone, a wireless local loop ("WLL") station, a personal digital assistant ("PDA"), a tablet, a netbook, a smartbook, an ultrabook, a handheld device having wireless connection capability, a Station ("STA"), or some other suitable processing device connected to a wireless modem. Accordingly, one or more aspects taught herein may be incorporated into a phone (e.g., a cellular phone, a smart phone), a computer (e.g., a desktop), a portable communication device, a portable computing device (e.g., a laptop, a personal data assistant, a tablet, a netbook, a smartbook, an ultrabook), medical devices or equipment, biometric sensors/devices, an entertainment device (e.g., a music or video device, or a satellite radio), a vehicular component or sensor, smart meters/sensors, industrial manufacturing equipment, a global positioning system device, or any other suitable device that is configured to communicate via a wireless or wired medium. In some aspects, the node is a wireless node. A wireless node may provide, for example, connectivity for or to a network (e.g., a wide area network such as the Internet or a cellular network) via a wired or wireless communication link.

While aspects may be described herein using terminology commonly associated with 3G and/or 4G wireless technologies, aspects of the present disclosure can be applied in other generation-based communication systems, such as 5G and later, including NR technologies.

An Example Wireless Communication System

FIG. 1 illustrates an example communications network 100 in which aspects of the present disclosure may be performed. For example, a transmitting device such as wireless node 116 or node B 102 (e.g., which can be a transmission reception point (TRP) or 5G Node B) can encode a set of information bits based on a low density parity check (LDPC) code to produce a code word, the LDPC code defined by a matrix having a first number of variable nodes and a second number of check nodes. A receiving device, such as wireless node 116 or node B 102 (e.g., which can be a transmission reception point (TRP) or 5G Node B), may receive the code word and perform decoding on the code word to recover the original set of information bits. In some cases, the decoding may be performed according to an adjusted minimum-sum algorithm described in greater detail below.

A Node B 102 (e.g., a TRP or 5G Node B) may include multiple antenna groups, one group including antennas 104 and 106, another group including antennas 108 and 110, and an additional group including antennas 112 and 114. In FIG. 1, only two antennas are shown for each antenna group, however, more or fewer antennas may be utilized for each antenna group. Wireless node 116 may be in communication with antennas 112 and 114, where antennas 112 and 114 transmit information to wireless node 116 over forward link 120 and receive information from wireless node 116 over reverse link 118. Wireless node 122 may be in communication with antennas 106 and 108, where antennas 106 and 108 transmit information to wireless node 122 over forward link 126 and receive information from wireless node 122 over reverse link 124. The Node B 102 may also be in communication with other wireless nodes, which may be, for example, Internet-of-Everything (IoE) devices. IoE device 136 may be in communication with one or more other antennas of Node B 102, where the antennas transmit information to IoE device 136 over forward link 140 and receive information from IoE device 136 over reverse link 138. IoE device 142 may be in communication with one or more other antennas of Node B 102, where the antennas transmit information to IoE device 142 over forward link 146 and receive information from IoE device 142 over reverse link 144. In a Frequency Division Duplex (FDD) system, communication links 118, 120, 124, 126, 138, 140, 144, and 146 may use different frequency for communication. For example, forward link 120 may use a different frequency than that used by reverse link 118, and forward link 140 may use a different frequency than that used by reverse link 138.

Each group of antennas and/or the area in which they are designed to communicate is often referred to as a sector of the Node B. In one aspect of the present disclosure, each antenna group may be designed to communicate to wireless nodes in a sector of the areas covered by Node B 102.

Wireless node 130 may be in communication with Node B 102, where antennas from the Node B 102 transmit information to wireless node 130 over forward link 132 and receive information from the wireless node 130 over reverse link 134.

In communication over forward links 120 and 126, the transmitting antennas of BS 102 may utilize beamforming in order to improve the signal-to-noise ratio of forward links for the different wireless nodes 116, 122, 136, and 142. Also, a Node B using beamforming to transmit to wireless nodes scattered randomly through its coverage causes less interference to wireless nodes in neighboring cells than a Node B transmitting through a single antenna to all its wireless nodes.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using TDD. A single component carrier bandwidth of 100 MHZ may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such central units or distributed units.

Figure 2:
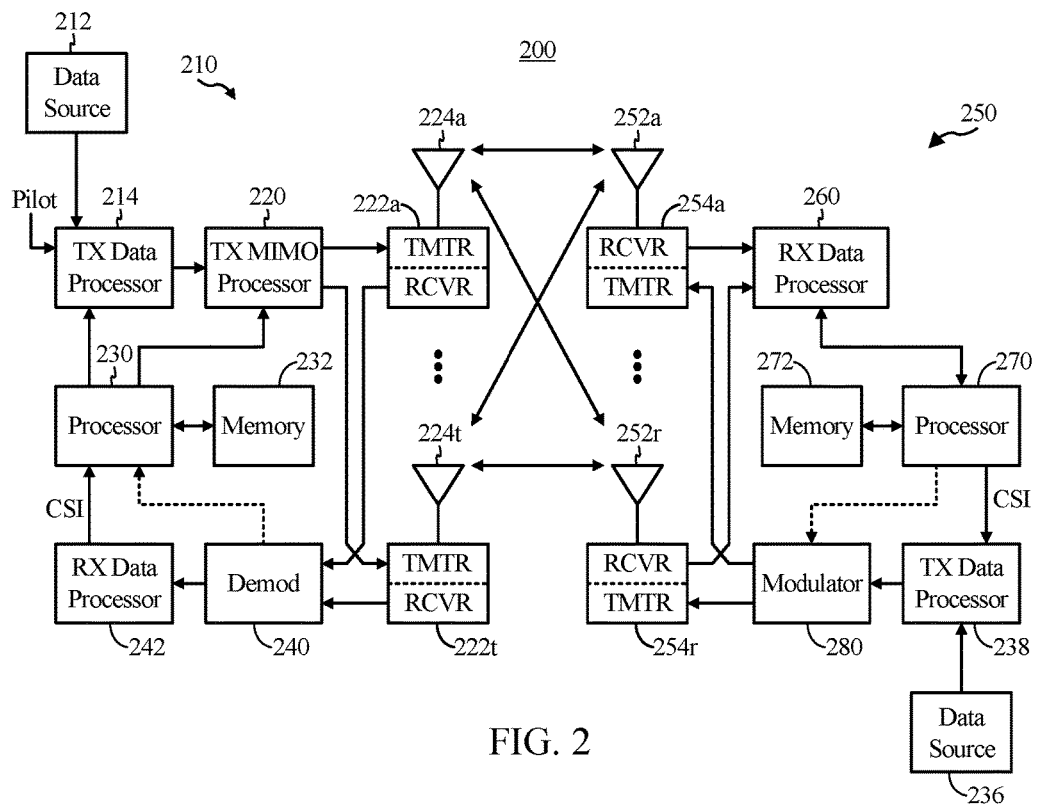
FIG. 2 illustrates a block diagram of a base station and a wireless node, in accordance with certain aspects of the present disclosure.

FIG. 2 illustrates a block diagram of an aspect of a transmitter system 210 (e.g., also known as the base station) and a receiver system 250 (e.g., also known as the wireless node) in a multiple-input multiple-output (MIMO) system 200. Each of system 210 and receiver system 250 has capabilities to both transmit and receive. Whether transmitter system 210 or receiver system 250 is transmitting, receiving, or transmitting and receiving simultaneously depends on the application. At the transmitter system 210, traffic data for a number of data streams is provided from a data source 212 to a transmit (TX) data processor 214.

In one aspect of the present disclosure, each data stream may be transmitted over a respective transmit antenna. TX data processor 214 formats, codes, and interleaves the traffic data for each data stream based on a particular coding scheme selected for that data stream to provide coded data. According to aspects described herein, the coding scheme may use LDPC codes and/or turbo codes.

The coded data for each data stream may be multiplexed with pilot data using OFDM techniques. The pilot data is typically a known data pattern that is processed in a known manner and may be used at the receiver system to estimate the channel response. The multiplexed pilot and coded data for each data stream is then modulated (e.g., symbol mapped) based on a particular modulation scheme (e.g., BPSK, QSPK, M-PSK, or M-QAM) selected for that data stream to provide modulation symbols. The data rate, coding, and modulation for each data stream may be determined by instructions performed by processor 230. Memory 232 may store data and software/firmware for the transmitter system 210.

The modulation symbols for all data streams are then provided to a TX MIMO processor 220, which may further process the modulation symbols (e.g., for OFDM). TX MIMO processor 220 then provides NT modulation symbol streams to NT transmitters (TMTR) 222a through 222t. In certain aspects of the present disclosure, TX MIMO processor 220 applies beamforming weights to the symbols of the data streams and to the antenna from which the symbol is being transmitted.

Each transmitter 222 receives and processes a respective symbol stream to provide one or more analog signals, and further conditions (e.g., amplifies, filters, and upconverts) the analog signals to provide a modulated signal suitable for transmission over the MIMO channel. NT modulated signals from transmitters 222a through 222t are then transmitted from NT antennas 224a through 224t, respectively.

At receiver system 250, the transmitted modulated signals may be received by NR antennas 252a through 252r and the received signal from each antenna 252 may be provided to a respective receiver (RCVR) 254a through 254r. Each receiver 254 may condition (e.g., filters, amplifies, and downconverts) a respective received signal, digitize the conditioned signal to provide samples, and further process the samples to provide a corresponding "received" symbol stream.

An RX data processor 260 then receives and processes the NR received symbol streams from NR receivers 254 based on a particular receiver processing technique to provide NT "detected" symbol streams. The RX data processor 260 then demodulates, deinterleaves, and decodes each detected symbol stream to recover the traffic data for the data stream. According to certain aspects, the RX data processor 260 may perform decoding on the detected symbols using techniques described herein, for example, by using an adjusted minimum-sum algorithm, described in greater detail below. In some cases, the processing by RX data processor 260 may be complementary to that performed by TX MIMO processor 220 and TX data processor 214 at transmitter system 210.

A processor 270 periodically determines which pre-coding matrix to use. Processor 270 formulates a reverse link message comprising a matrix index portion and a rank value portion. Memory 272 may store data and software/firmware for the receiver system 250. The reverse link message may comprise various types of information regarding the communication link and/or the received data stream. The reverse link message is then processed by a TX data processor 238, which also receives traffic data for a number of data streams from a data source 236, modulated by a modulator 280, conditioned by transmitters 254a through 254r, and transmitted back to transmitter system 210.

At transmitter system 210, the modulated signals from receiver system 250 are received by antennas 224, conditioned by receivers 222, demodulated by a demodulator 240, and processed by a RX data processor 242 to extract the reserve link message transmitted by the receiver system 250. Processor 230 then determines which pre-coding matrix to use for determining the beamforming weights, and then processes the extracted message.

Any one of the processor 270, RX data processor 260, TX data processor 238, or other processors/elements, or a combination thereof of the wireless node 250 and/or any one of the processor 230, TX MIMO processor 220, TX data processor 214, RX data processor 242, or other processors/elements, or a combination thereof of the access point 210 may be configured to perform the procedures for connectionless access in accordance with certain aspects of the present disclosure discussed below. In an aspect, at least one of the processor 270, RX data processor 260, and TX data processor 238 may be configured to execute algorithms stored in memory 272 for performing the random-access channel (RACH) procedures for connectionless access described herein. In another aspect, at least one of the processor 230, TX MIMO processor 220, TX data processor 214, and RX data processor 242 may be configured to execute algorithms stored in memory 232 for performing the RACH procedures for connectionless access described herein.

Figure 3:
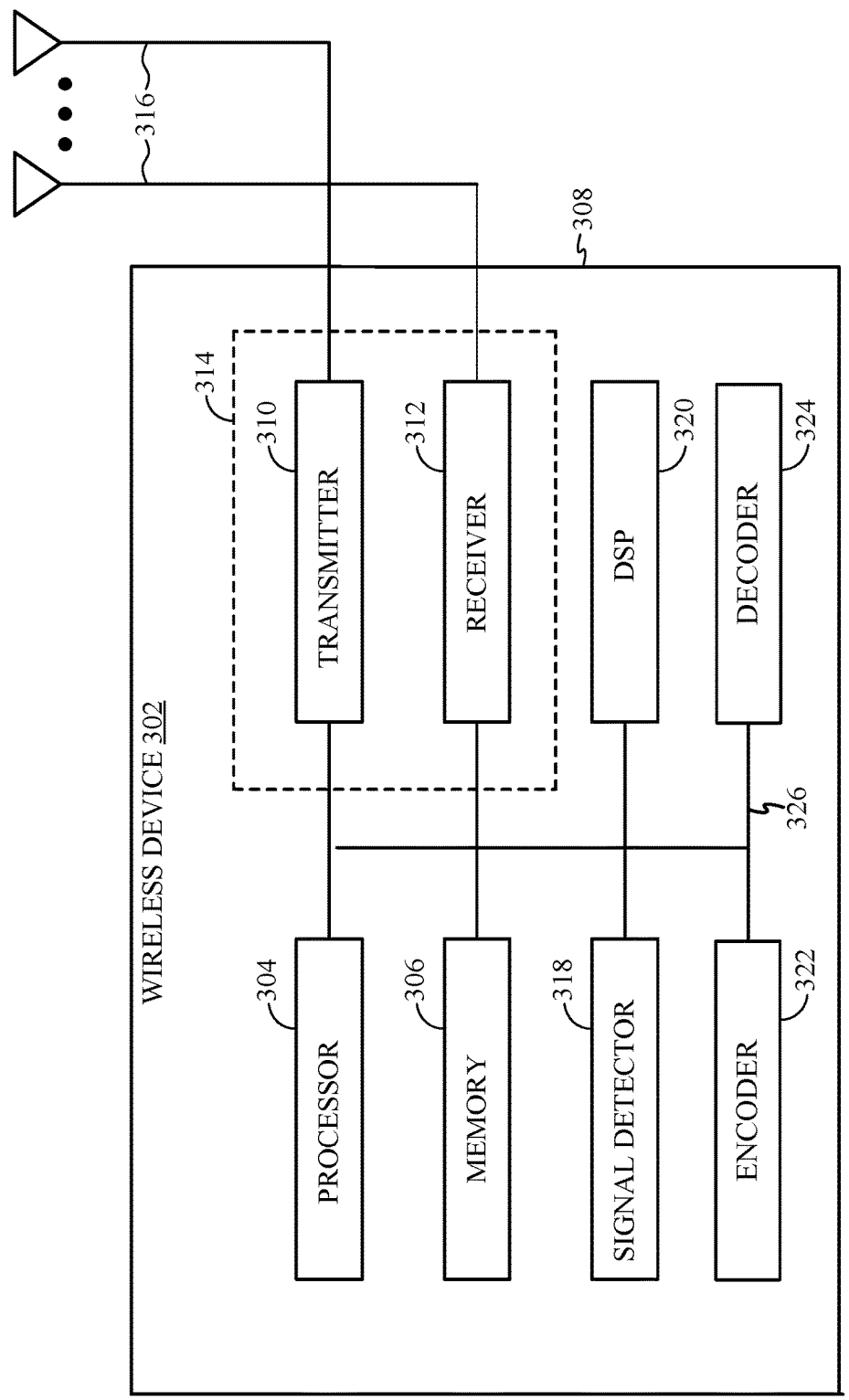
FIG. 3 illustrates various components that may be utilized in a wireless device, in accordance with certain aspects of the present disclosure.

FIG. 3 illustrates various components that may be utilized in a wireless device 302 that may be employed within the communications network 100 illustrated in FIG. 1. The wireless device 302 is an example of a device that may be configured to implement the various methods described herein. The wireless device 302 may be a Node B 102 (e.g., a TRP) or any of the wireless nodes (e.g., wireless nodes 116, 122, 130 or IoT device 136 or 142). For example, the wireless device 302 may be configured to perform operations 900 described in FIG. 9, as well as other operations described herein The wireless device 302 may include a processor 304 that controls operation of the wireless device 302. The processor 304 may also be referred to as a central processing unit (CPU). Memory 306, which may include both read-only memory (ROM) and random access memory (RAM), provides instructions and data to the processor 304. A portion of the memory 306 may also include non-volatile random access memory (NVRAM). The processor 304 typically performs logical and arithmetic operations based on program instructions stored within the memory 306. The instructions in the memory 306 may be executable to implement the methods described herein, for example, to allow a UE to transmit data efficiently during a connectionless access. Some non-limiting examples of the processor 304 may include Snapdragon processor, application specific integrated circuits (ASICs), programmable logic, etc.

The wireless device 302 may also include a housing 308 that may include a transmitter 310 and a receiver 312 to allow transmission and reception of data between the wireless device 302 and a remote location. The transmitter 310 and receiver 312 may be combined into a transceiver 314. A single or a plurality of transmit antennas 316 may be attached to the housing 308 and electrically coupled to the transceiver 314. The wireless device 302 may also include (not shown) multiple transmitters, multiple receivers, and multiple transceivers. The wireless device 302 can also include wireless battery charging equipment.

The wireless device 302 may also include a signal detector 318 that may be used in an effort to detect and quantify the level of signals received by the transceiver 314. The signal detector 318 may detect such signals as total energy, energy per subcarrier per symbol, power spectral density and other signals. The wireless device 302 may also include a digital signal processor (DSP) 320 for use in processing signals.

Additionally, the wireless device may also include an encoder 322 for use in encoding signals for transmission and a decoder 324 for use in decoding received signals. According to certain aspects, the decoder 324 may perform decoding according to certain aspects presented herein (e.g., by implementing operations 900 illustrated in FIG. 9).

The various components of the wireless device 302 may be coupled together by a bus system 326, which may include a power bus, a control signal bus, and a status signal bus in addition to a data bus. The processor 304 may be configured to access instructions stored in the memory 306 to perform connectionless access, in accordance with aspects of the present disclosure discussed below.

Example Error Correction Coding

Many communications systems use error-correcting codes. Specifically, error-correcting codes compensate for the intrinsic unreliability of information transfer in these systems by introducing redundancy into the data stream. Low-density parity check (LDPC) codes are a particular type of error correcting codes which use an iterative coding system. In particular, Gallager codes are an early example of regular LDPC codes. LDPC codes are linear block codes in which most of the elements of its parity check matrix H are set to '0'.

LDPC codes can be represented by bipartite graphs (often referred to as "Tanner graphs"), wherein a set of variable nodes corresponds to bits of a code word (e.g., information bits or systematic bits), and a set of check nodes correspond to a set of parity-check constraints that define the code. Edges in the graph connect variable nodes to check nodes. Thus, the nodes of the graph are separated into two distinctive sets, variable nodes and check nodes, with edges connecting the two different types of nodes.

A lifted graph is created by copying a bipartite base graph (G), which may also be known as a protograph, a number of times, Z. A variable node and a check node may be considered "neighbors" if they are connected by an "edge" (i.e., the line connecting the variable node and the check node) in the graph. In addition, for each edge (e) of the bipartite base graph (G), a permutation is applied to the Z copies of edge (e) to interconnect the Z copies of G. A bit sequence having a one-to-one association with the variable node sequence is a valid codeword if, and only if, for each check node, the bits associated with all neighboring variable nodes sum to zero modulo two (i.e., they include an even number of 1's). The resulting LDPC code may be quasi-cyclic (QC) if the permutations used are cyclic.

Figures 4, 4A:
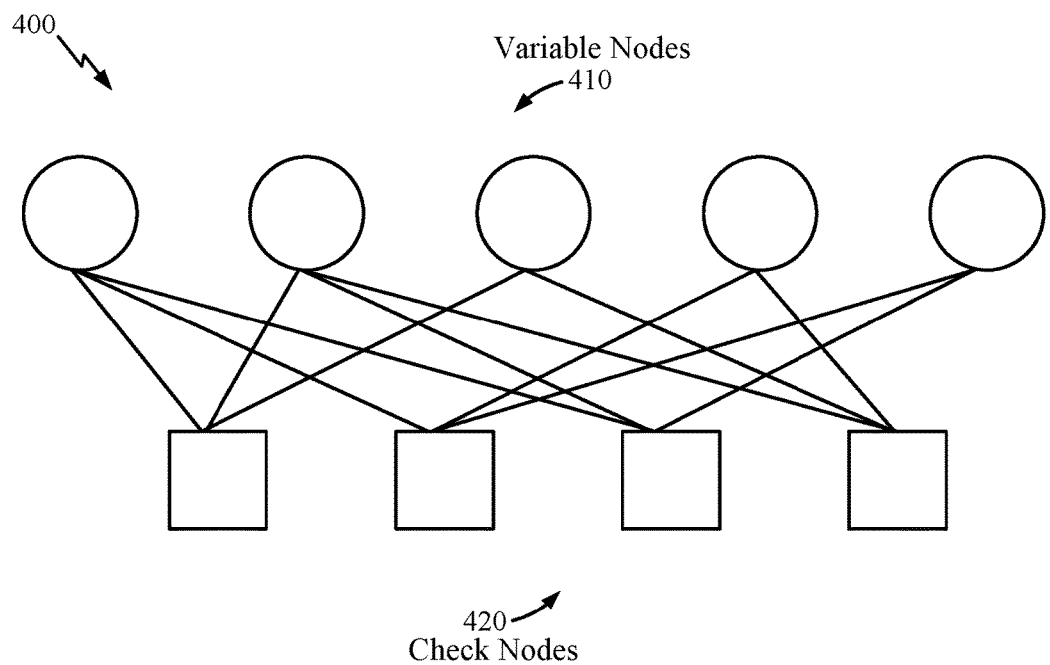
FIGS. 4-4A show graphical and matrix representations of an exemplary low density parity check (LDPC) code, in accordance with certain aspects of the present disclosure.

FIGS. 4-4A show graphical and matrix representations of an exemplary LDPC code, in accordance with certain aspects of the present disclosure. For example, FIG. 4 shows a bipartite graph 400 representing an exemplary LDPC code. The bipartite graph 400 includes a set of 5 variable nodes 410 (represented by circles) connected to 4 check nodes 420 (represented by squares). Edges in the graph 400 connect variable nodes 410 to the check nodes 420 (represented by the lines connecting the variable nodes 410 to the check nodes 420). This graph consists of |V|=5 variable nodes and |C|=4 check nodes, connected by |E|=12 edges.

The bipartite graph may be represented by a simplified adjacency matrix, which may also be known as a parity check matrix. FIG. 4A shows a matrix representation 400A of the bipartite graph 400. The matrix representation 400A includes a parity check matrix H and a code word vector x, where x1-x5 represent bits of the code word x. The parity matrix H is used for determining whether a received signal was normally decoded. The parity check matrix H has C rows corresponding to j check nodes and V columns corresponding to i variable nodes (i.e., a demodulated symbol), where the rows represent the equations and the columns represents the bits of the code word. In FIG. 4A, matrix H has 4 rows and 5 columns corresponding to 4 check nodes and 5 variable nodes respectfully. If a j-th check node is connected to an i-th variable node by an edge, i.e., the two nodes are neighbors, then there is a 1 in the i-th column and in the j-th row of the parity check matrix H. That is, the intersection of an i-th row and a j-th column contains a "1" where an edge joins the corresponding vertices and a "0" where there is no edge. The code word vector x represents a valid code word if, and only if, Hx=0 (e.g., if, for each constraint node, the bits neighboring the constraint (via their association with variable nodes) sum to zero modulo two, i.e., they comprise an even number of ones). Thus, if the code word is received correctly, then Hx=0 (mod 2). When the product of a coded received signal and the parity check matrix H becomes '0', this signifies that no error has occurred. The parity check matrix is a C row by V column binary matrix. The rows represent the equations and the columns represent the digits in the code word.

The number of demodulated symbols or variable nodes is the LDPC code length. The number of non-zero elements in a row (column) is defined as the row (column) weight dc (dv).

The degree of a node refers to the number of edges connected to that node. This feature is illustrated in the H matrix shown in FIG. 4A where the number of edges incident to a variable node 410 is equal to the number of 1's in the corresponding column and is called the variable node degree d(v). Similarly, the number of edges connected with a check node 420 is equal to the number of ones in a corresponding row and is called the check node degree d(c).

A regular graph or code is one for which all variable nodes have the same degree, j, and all constraint nodes have the same degree, k. In this case, we say that the code is a (j, k) regular code. On the other hand, an irregular code has constraint nodes and/or variable nodes of differing degrees. For example, some variable nodes may be of degree 4, others of degree 3 and still others of degree 2.

"Lifting" enables LDPC codes to be implemented using parallel encoding and/or decoding implementations while also reducing the complexity typically associated with large LDPC codes. Lifting helps enable efficient parallelization of LDPC decoders while still having a relatively compact description. More specifically, lifting is a technique for generating a relatively large LDPC code from multiple copies of a smaller base code. For example, a lifted LDPC code may be generated by producing Z number of parallel copies of a base graph (e.g., protograph) and then interconnecting the parallel copies through permutations of edge bundles of each copy of the base graph. The base graph defines the (macro) structure of the code and consists of a number (K) of information bit-columns and a number (N) of code bit columns. Lifting the base graph a number (Z) of results in a final block length of KZ.

Thus, a larger graph can be obtained by a "copy and permute" operation where multiple copies of the base graph are made and connected to form a single lifted graph. For the multiple copies, like edges that are a set of copies of a single base edge, are permutated and connected to form a connected graph Z times larger than the base graph.

Figure 5:
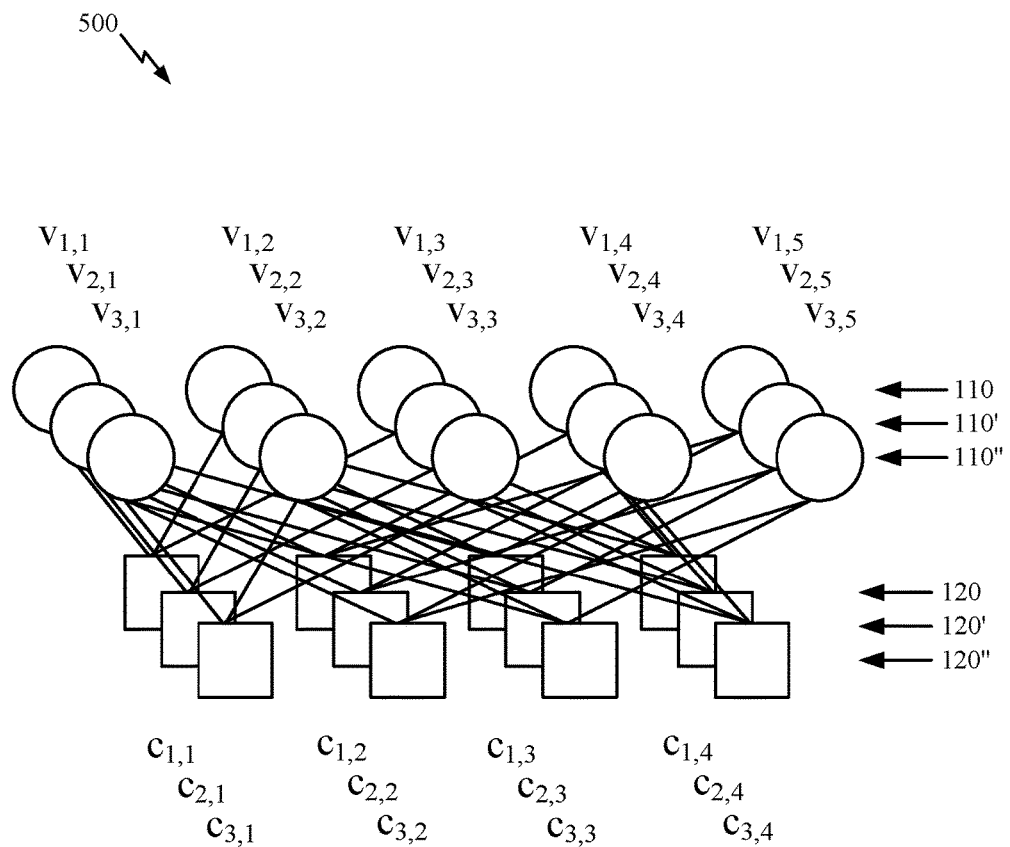
FIG. 5 graphically illustrates lifting of the LDPC code of FIG. 4A, in accordance with certain aspects of the present disclosure.

FIG. 5 graphically illustrates the effect of making three copies of the graph of FIG. 4. Three copies may be interconnected by permuting like edges among the copies. If the permutations are restricted to cyclic permutations, then the resulting graph corresponds to a quasi-cyclic LDPC with lifting Z=3. The original graph from which three copies were made is referred to herein as the base graph. To obtain derived graphs of different sizes, we can apply the "copy and permute" operation to a base graph.

A corresponding parity check matrix of the lifted graph can be constructed from the parity check matrix of the base graph by replacing each entry in the base parity check matrix with a Z×Z matrix. The 0 entries (those having no base edges) are replaced with the 0 matrix and the 1 entries (indicating a base edge) are replaced with a Z×Z permutation matrix. In the case of cyclic liftings the permutations are cyclic permutations.

A cyclically lifted LDPC code can also be interpreted as a code over the ring of binary polynomials modulo $x^Z+1$. In this interpretation, a binary polynomial, $(x)=b_0+b_1 x+b_2 x^2+\ldots+b_{Z-1}x^{Z-1}$ may be associated to each variable node in the base graph. The binary vector $(b_0, b_1, b_2, \ldots, b_{Z-1})$ corresponds to the bits associated to Z corresponding variable nodes in the lifted graph, that is, Z copies of a single base variable node. A cyclic permutation by k of the binary vector is achieved by multiplying the corresponding binary polynomial by $x^k$ where multiplication is taken modulo $x^Z+1$. A degree d parity check in the base graph can be interpreted as a linear constraint on the neighboring binary polynomials $B_1(x), \ldots, B_d(x)$ written as $x^{k_1} B_1(x)+x^{k_2} B_2(x)+\ldots+x^{k_d}B_d(x)=0$ where the values, $k_1, \ldots, k_d$ are the cyclic lifting values associated to the corresponding edges.

This resulting equation is equivalent to the Z parity checks in the cyclically lifted Tanner graph corresponding to the single associated parity check in the base graph. Thus, the parity check matrix for the lifted graph can be expressed using the matrix for the base graph in which 1 entries are replaced with monomials of the form $x^k$ and 0 entries are lifted as 0, but now the 0 is interpreted as the 0 binary polynomial modulo $x^Z+1$. Such a matrix may be written by giving the value k in place of $x^k$. In this case the 0 polynomial is sometimes represented as −1 and sometimes as another character in order to distinguish it from $x^0$.

Figure 6:
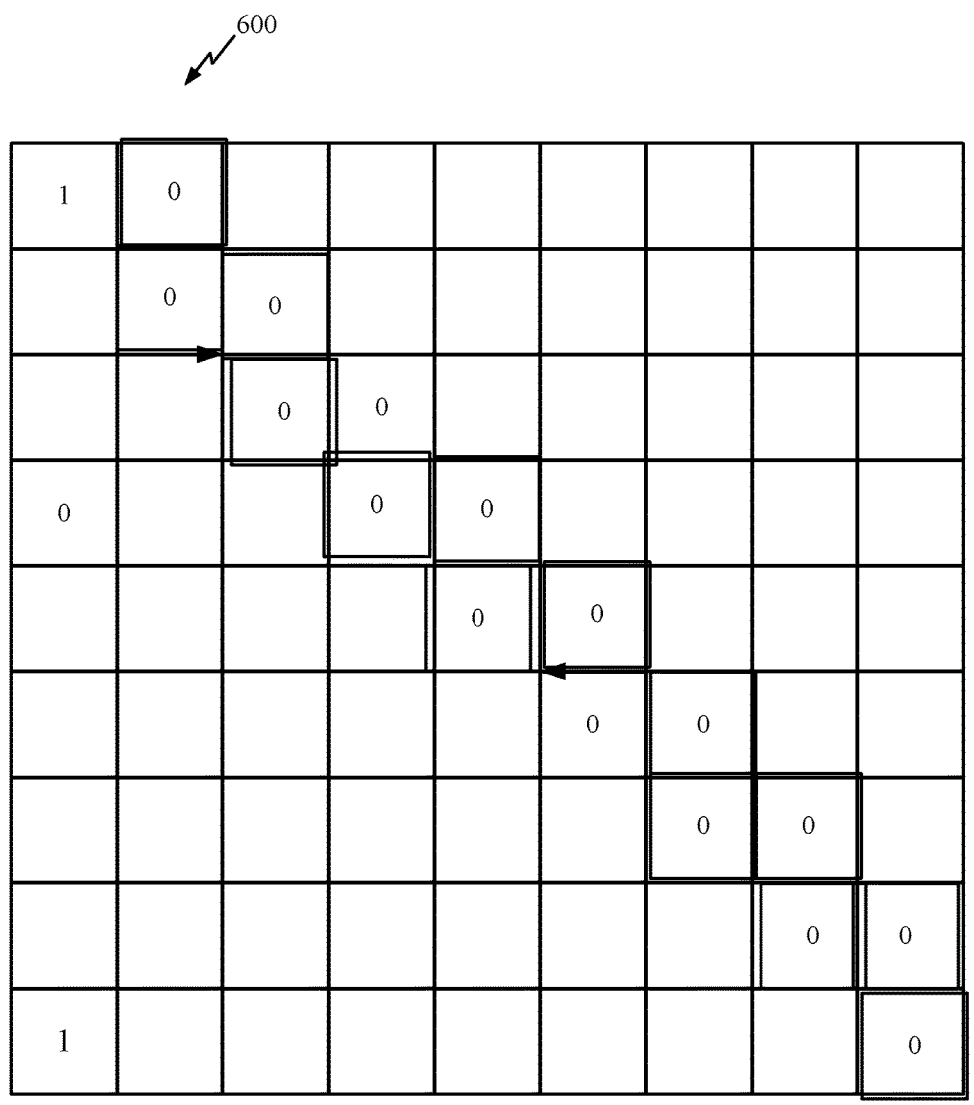
FIG. 6 is an integer representation of a matrix for a quasi-cyclic 802.11 LDPC code.

Typically, a square submatrix of the parity check matrix represents the parity bits of the code. The complementary columns correspond to information bits that, at the time of encoding, are set equal to the information bits to be encoded. The encoding may be achieved by solving for the variables in the aforementioned square submatrix in order to satisfy the parity check equations. The parity check matrix H may be partitioned into two parts M and N where M is the square portion. Thus, encoding reduces to solving Mc=s=Nd where c and d comprise x. In the case of quasi-cyclic codes, or cyclically lifted codes, the above algebra can be interpreted as being over the ring of binary polynomials modulo $x^Z+1$. In the case of the 802.11 LDPC codes, which are quasi-cyclic, the encoding submatrix M has an integer representation as shown in FIG. 6.

A received LDPC code word can be decoded to produce a reconstructed version of the original code word. In the absence of errors, or in the case of correctable errors, decoding can be used to recover the original data unit that was encoded. Redundant bits may be used by decoders to detect and correct bit errors. LDPC decoder(s) generally operate by iteratively performing local calculations and passing those results by exchanging messages within the bipartite graph 400, along the edges, and updating these messages by performing computations at the nodes based on the incoming messages. These steps may typically be repeated several times and may be referred to as message passing steps. For example, each variable node 410 in the graph 400 may initially be provided with a "soft bit" (e.g., representing the received bit of the code word) that indicates an estimate of the associated bit's value as determined by observations from the communications channel. Using these soft bits the LDPC decoders may update messages by iteratively reading them, or some portion thereof, from memory and writing an updated message, or some portion thereof, back to, memory. The update operations are typically based on the parity check constraints of the corresponding LDPC code. In implementations for lifted LDPC codes, messages on like edges are often processed in parallel.

LDPC codes designed for high speed applications often use quasi-cyclic constructions with large lifting factors and relatively small base graphs to support high parallelism in encoding and decoding operations. LDPC codes with higher code rates (e.g., the ratio of the message length to the code word length) tend to have relatively fewer parity checks. If the number of base parity checks is smaller than the degree of a variable node (e.g., the number of edges connected to a variable node), then, in the base graph, that variable node is connected to at least one of the base parity checks by two or more edges (e.g., the variable node may have a "double edge"). Or if the number of base parity checks is smaller than the degree of a variable node (e.g., the number of edges connected to a variable node), then, in the base graph, that variable node is connected to at least one of the base parity checks by two or more edges. Having a base variable node and a base check node connected by two or more edges is generally undesirable for parallel hardware implementation purposes. For example, such double edges may result in multiple concurrent read and write operations to the same memory locations, which in turn may create data coherency problems. A double edge in a base LDPC code may trigger parallel reading of the same soft bit value memory location twice during a single parallel parity check update. Thus, additional circuitry is typically needed to combine the soft bit values that are written back to memory, so as to properly incorporate both updates. However, eliminating double edges in the LDPC code helps to avoid this extra complexity LDPC code designs based on cyclic lifting can be interpreted as codes over the ring of polynomials modulo may be binary polynomials modulo $x^Z+1$, where Z is the lifting size (e.g., the size of the cycle in the quasi-cyclic code). Thus encoding such codes can often be interpreted as an algebraic operation in this ring.

In the definition of standard irregular LDPC code ensembles (degree distributions) all edges in the Tanner graph representation may be statistically interchangeable. In other words, there exists a single statistical equivalence class of edges. A more detailed discussion of lifted LDPC codes may be found, for example, in the book titled, "Modern Coding Theory," published Mar. 17, 2008, by Tom Richardson and Ruediger Urbanke. For multi-edge LDPC codes, multiple equivalence classes of edges may be possible. While in the standard irregular LDPC ensemble definition, nodes in the graph (both variable and constraint) are specified by their degree, i.e., the number of edges they are connected to, in the multi-edge type setting an edge degree is a vector; it specifies the number of edges connected to the node from each edge equivalence class (type) independently. A multi-edge type ensemble is comprised of a finite number of edge types. The degree type of a constraint node is a vector of (non-negative) integers; the i-th entry of this vector records the number of sockets of the i-th type connected to such a node. This vector may be referred to as an edge degree. The degree type of a variable node has two parts although it can be viewed as a vector of (non-negative) integers. The first part relates to the received distribution and will be termed the received degree and the second part specifies the edge degree. The edge degree plays the same role as for constraint nodes. Edges are typed as they pair sockets of the same type. This constraint, that sockets must pair with sockets of like type, characterizes the multi-edge type concept. In a multi-edge type description, different node types can have different received distributions (e.g., the associated bits may go through different channels).

Figure 7:
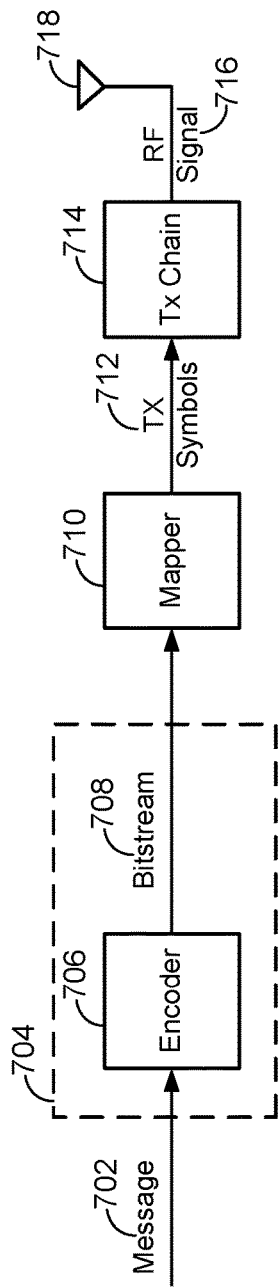
FIG. 7 is a simplified block diagram illustrating a puncturing encoder, in accordance with certain aspects of the present disclosure.

FIG. 7 is a simplified block diagram illustrating an encoder, in accordance with certain aspects of the present disclosure. FIG. 7 illustrates a portion of a radio frequency (RF) modem 704 that may be configured to provide an encoded message for wireless transmission (e.g., using a coding scheme such as LDPC, Turbo Codes, Polar codes, etc.). In one example, an encoder 706 (e.g., an LDPC encoder or Turbo code encoder) in a base station (e.g., BS 102) (or a UE 120 on the reverse path) receives a message 702 for transmission. The message 702 may contain data and/or encoded voice or other content directed to the receiving device. The encoder 706 encodes the message using a suitable modulation and coding scheme (MCS), typically selected based on a configuration defined by the BS 102 or another network entity. The encoded bitstream 708 (e.g., representing to the encoded message 702) may then be provided to a mapper 710 that generates a sequence of Tx symbols 712 that are modulated, amplified and otherwise processed by Tx chain 714 to produce an RF signal 716 for transmission through antenna 718.

Figure 8:
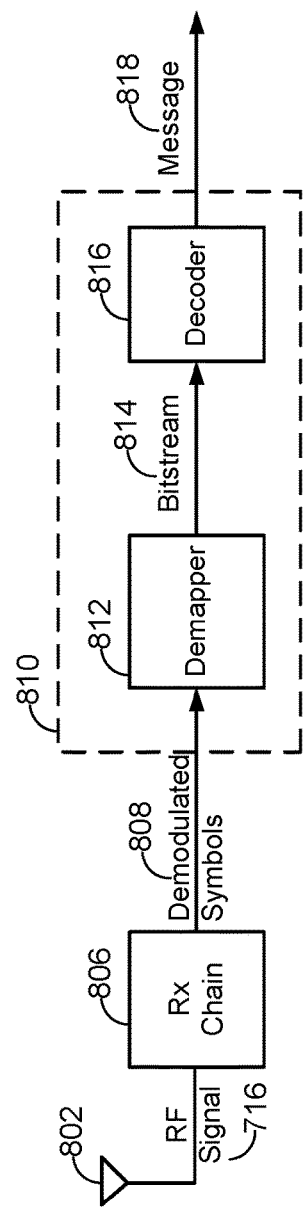
FIG. 8 is a simplified block diagram illustrating a decoder, in accordance with certain aspects of the present disclosure.

FIG. 8 is a simplified block diagram illustrating a decoder, in accordance with certain aspects of the present disclosure. FIG. 8 illustrates a portion of a RF modem 810 that may be configured to receive and decode (e.g., using techniques presented herein) a wirelessly transmitted signal including an encoded message. In various examples, the modem 810 receiving the signal may reside at the access terminal, at the base station, or at any other suitable apparatus or means for carrying out the described functions. An antenna 802 provides an RF signal 716 (i.e., the RF signal produced in FIG. 7) to an access terminal (e.g., UE 120). An Rx chain 806 processes and demodulates the RF signal 716 and may provide a sequence of demodulated symbols 808 to a demapper 812, which produces a sequence of a-priori probabilities in a bitstream 814, often represented as log-likelihood ratios (LLRs) corresponding to the encoded message.

Figure 9:
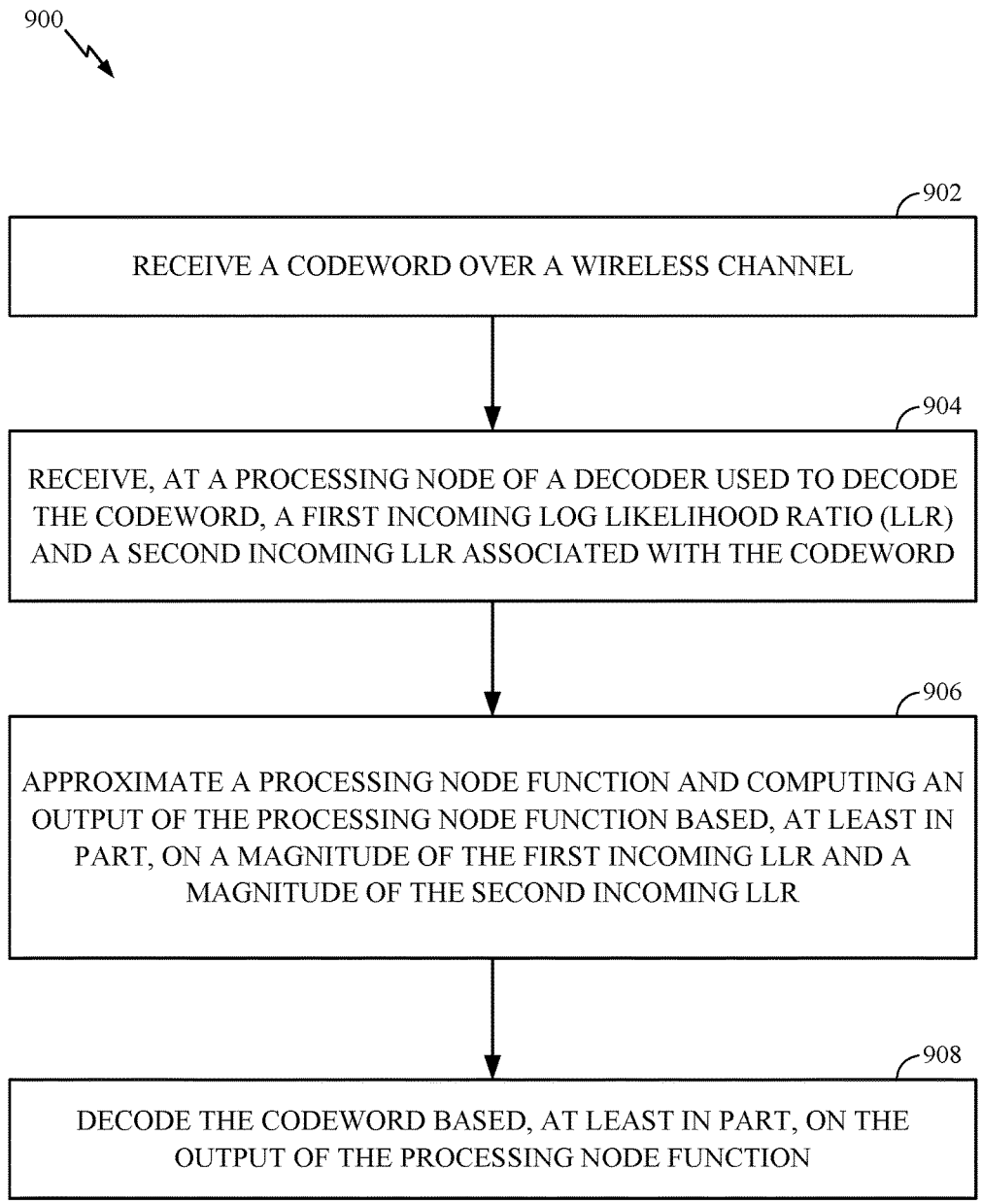
FIG. 9 illustrates example operations for wireless communications, in accordance with certain aspects of the present disclosure.

A decoder 816 may then be used to decode m-bit information strings from the bitstream 814 that has been encoded using a coding scheme such as LDPC and/or Turbo Codes. The decoder 816 may comprise a polar decoder, an LDPC decoder, a Turbo Code decoder, a Viterbi decoder, an algebraic decoder, a butterfly decoder, or another suitable decoder. In one example, an LDPC decoder and/or a Turbo Code decoder employs a message-passing algorithm, such as a sum-product (SP) decoding algorithm and/or a minimum-sum (MS) decoding algorithm, to decode the bitstream 814. Message-passing algorithms operate by passing messages between check nodes and variable nodes along the edges of a bipartite graph. When decoding is successful the decoder 816 may convert the bitstream 814 (e.g., a sequence of LLRs) into the message 818 corresponding to the message 702. In some cases, decoding efficiency and latency of low density parity check (LDPC) codes and turbo codes may be improved, for example, by using an adjusted minimum-sum algorithm, described in greater detail below. In some cases, the decoder 816 may be configured to decode a codeword, for example, by implementing operations 900 as illustrated in FIG. 9.

Example Adjusted Min-Sum Decoder

LDPC codes, when combined with sum-product (SP) decoding algorithm, is a powerful system for low-complexity error-correction coding. LDPC codes have been used in many standards such as 802.11n, 802.11ad, WiMAX, ATSC, etc., and are a strong candidate to replace Turbo codes in next-generation cellular technology (e.g., 5G). Turbo codes are used in 3G and 4G cellular systems and in other applications. Turbo codes and LDPC codes are both typically decoded using message-passing iterative decoders, for example, as described above.

Additionally, as discussed above, LDPC codes are often defined using a Tanner graph: a bipartite graph consisting of variable nodes and check nodes, for example, as illustrated in FIG. 4A. Message-passing iterative decoders, such as a sum-product (SP) decoder, operate by passing messages between check and variable nodes along edges of the graph and with computation performed at the nodes to determine outgoing messages.

An SP decoding algorithm, used by an SP decoder when decoding LDPC codes, is a message-passing algorithm that may best be explained in terms of log-likelihood ratios (LLR). For example, at the variable node side of the LDPC bipartite graph (e.g., variable nodes 410) an outgoing message may simply be computed as the sum of the incoming LLRs at the variable nodes 410, typically including an LLR from a channel observation. At the check node side of the bipartite graph (e.g., check nodes 420) the incoming LLRs are processed as follows.

Aspects of the present disclosure will now describe the SP algorithm for LDPC codes in greater detail. Messages (e.g., log likelihood ratios (LLRs)) may be denoted by $m^{C2V}$ for messages from check nodes to variable nodes and by $m^{V2C}$ for messages (e.g., LLRs) from variable nodes to check nodes. Consider a variable node with d edges. For each edge, $j=1, \ldots, d$ messages to check nodes may be given as:

$$m^{V2C}(j) = r + \left(\sum_{i=1}^{d} m^{C2V}(i)\right) - m^{C2V}(j).$$

At the very beginning of the decoding process the decoder may set $m^{C2V}=0$ for every edge.

According to aspects, at the check nodes it may be more convenient to represent the messages using a sign and magnitude representation. Thus for a message, m, let $m_p \in GF[2]$ denote the 'parity' of the message, that is, $m_p=0$ if $m \geq 0$ and $m_p=1$ if $m<0$. Additionally let $m_r \in R^+$ denote the magnitude of m. Thus, we have $m=(-1)^{m_p} m_r$. At the check node, the updates for $m_p$ and $m_r$ separate. For example, we have, for a degree d check node, $$m_p^{C2V}(j) = \left(\sum_{i=1}^{d} m_p^{V2C}(i)\right) - m_p^{V2C}(j)$$

where addition is over GF[2] (e.g., the binary field) and $$m_r^{C2V}(j) = g^{-1}\left(\left(\sum_{i=1}^{d} g(m_r^{V2C}(i)) - f(m_r^{V2C}(j))\right)\right)$$

(e.g., which represents the SP check magnitude update) where addition is over the $R^+$. According to aspects, the function, g, may be defined by $g(x)=\ln(\coth(x/2))$.

It should be noted that g may be its own inverse, which means that for all $x \in R^+$, $g^{-1}(x)=g(x)$. It is evident that, taking this approach to representing belief propagation, that the main computational difficulty is to implement the function g and its inverse. Note that all other operations will be of low complexity.

According to aspects, the MS algorithm can be understood as a lower complexity variation of the SP algorithm. For example, the check SP update may be replaced with an MS check magnitude update:

$$m_r^{C2V}(j) = \min\{\{m_r^{V2C}(i)\}_{i=1 \ldots d} - \{m_r^{V2C}(j)\}\}.$$

According to aspects, the MS algorithm may generally not perform as well as the SP algorithm. The MS algorithm, however, is simpler to implement and has lower complexity. For example, one significant advantage it offers from an implementation perspective is that the set of outgoing messages from a check node have at most two distinct magnitudes. Indeed, it can be seen that the MS check magnitude update equation gives only two possible values as function of j, either the smallest or second smallest value in the set $\{m_r^{V2C}(i)\}_{i=1 \ldots d}$.

In the case of turbo codes, there is a corresponding decoder whose primary operation (e.g., a BCJR decoding algorithm) may be performed on a trellis representing a constituent convolution code. Under ideal conditions, the BCJR algorithm computes a Maximum a posteriori probability (MAP) and extrinsic LLRs that are associated with message bits in the turbo code. The MAP and extrinsic LLRs may be exchanged between different instances of the constituent convolutional codes and the BCJR algorithm is repeated in an iterative fashion.

In some cases, the BCJR decoding algorithm for turbo codes and the SP decoding algorithm for LDPC codes may require the implementation of certain relatively complex operations. Many approximations of these decoding algorithms may be based on simplifications of these operations. For example, aspects presented herein provide a new, high-performing algorithm that improves to the approximation to the SP check node magnitude update for LDPC codes that has the additional advantage of reusing a key operation required for the BCJR algorithm. Consequently, in addition to providing better performance for LDPC decoders, the algorithm proposed herein indicates an effective way to develop a unified decoder supporting both turbo codes and LDPC codes with high performance.

For example, let us focus again on the check node magnitude update for LDPC codes in the SP decoding algorithm. To simplify notation, let $m_r^{V2C}(j)$ be denoted as $l_j$ and $m_r^{C2V}(j)$ be denoted as $L_j$. If we define the two argument function, U(A,B), as $$U(A, B) = g^{[-1]}(g(A) + g(B)) = \ln\coth\frac{\left(\ln\coth\frac{A}{2} + \ln\coth\frac{B}{2}\right)}{2},$$

then the check node magnitude update may be defined in a nested fashion as:

$$L_i = U(l_d, \ldots, U(l_{i+1}, U(l_{i-1}, \ldots, U(l_1, l_2))))$$

This nested check node magnitude update, together with the sign update, defines the full SP decoder operation at the check node side. However, even though the operation appears mathematically simple, it poses significant challenges in the hardware implementation of the SP decoder as it involves a non-linear operator given by U(A,B) above.

In the case of turbo codes, there is a function related to U that is required to perform update operations on posterior probabilities for states in the trellis as part of the BCJR algorithm that takes the form $F(A,B)=\ln(e^A+e^B)$. For turbo codes, there is an approximation and simplification which corresponds to the MS algorithm in the LDPC case in which F(A,B) is replaced with max(A,B). Substituting this operation into the BCJR to the resulting Turbo decoder is called the max-log-map decoder.

For an LDPC check node update let us refer to the set $\{m_r^{V2C}(i)\}_{i=1 \ldots d} = \{l_i\}_{i=1 \ldots d}$ as the incoming LLRmags and the set $\{m_r^{V2C}(i)\}_{i=1 \ldots d} = \{L_i\}_{i=1 \ldots d}$ as the outgoing LLRmags. As mentioned above, it follows from the definition of the MS decoder that the outgoing LLRmags in the MS decoder take on only at most two distinct values. One value is the minimum of all incoming LLRmags and the other is the second smallest incoming LLRmag (hereinafter referred to as the "second minimum"). According to certain aspects, the second minimum is the outgoing LLRmag on the edge that had the incoming minimum LLRmag, and the LLRmag of all other outgoing messages is the minimum incoming LLRmag. According to aspects, this makes it possible to store the set, d, of outgoing messages from a check node in a very compact manner—a primary advantage of the MS decoder. Besides the outgoing signs, it is sufficient to store only two outgoing LLRmags and an index pointing to the edge that carried the minimum incoming LLRmag, as compared to storing d outgoing LLRs as would be required for the SP decoder. This compression may be exploited in many LDPC implementations to significantly reduce the amount of memory needed to implement the decoder.

According to certain aspects, the outgoing LLRmags in an MS decoder may be larger than the LLRmags in the SP decoder for the same incoming LLRmags. For very large graphs, the SP algorithm may have close-to-optimal performance (e.g., compared to using a maximum a posteriori (MAP) decoder) whereas the MS algorithm generally has inferior performance. For example, it has been observed that, for very large graphs, the MS decoder may degrade performance by as much as 1 dB at low code rates such as 1/5. This performance loss may be reduced to a certain extent, however, by modifying the MS algorithm to more-closely mimic the SP algorithm. For example, the MS algorithm may be modified/adjusted to include an offset MS (OMS) or normalized MS (NMS) wherein the outgoing LLRmags given by the MS algorithm are reduced either by subtracting a small offset (e.g., with OMS) or by scaling (multiplying) by a parameter less than one (e.g., with NMS).

Adjusted Min-Sum Algorithm

According to certain aspects, the performance of both OMS and NMS may be improved by optimizing the offset/normalization values to depend on various parameters such as code rate, check node degree, iteration number, etc. According to aspects, to achieve performance as close to SP as possible, it may be desirable for the offset or correction to MS to depend on the other (non-minimum or second minimum) incoming LLRmags. Thus, even though only two outgoing magnitudes may be used, their value may depend on incoming LLRmags to more closely approximate SP. For example, in some cases, the SP outgoing LLRmag may be used for the edge with the minimum incoming LLRmag and a value from the SP corresponding to a check sum of all incoming LLRmags may be used for all other edges. Some improvement on this technique may be achieved, as described below.

Assuming the approximation of U using a min operation, another interpretation of the MS algorithm may be to use the maximum and the second maximum (e.g., the next largest maximum after the true maximum) outgoing LLR magnitudes. Indeed, in the MS algorithm the maximum outgoing magnitude is the second minimum of the incoming magnitudes and the second maximum outgoing magnitude is the incoming minimum magnitude, which amounts to approximating U in the SP algorithm by the min operation. According to certain aspects, one option to improve the MS algorithm may be to use these two values (maximum outgoing and second maximum outgoing) as computed using the correct function U. This would mean, for example, computing outgoing magnitudes according to the SP algorithm but then replacing all magnitudes less than the second largest magnitude (e.g., second maximum) with second largest magnitude. Note, however, that as in the MS decoder, all outgoing magnitudes other than the maximum are equal, thus requiring the same storage complexity at the MS decoder. Thus, this analogy could equally be applied using any of the outgoing magnitudes other than the second maximum being the alternate value.

However, performance improvement may be achieved by instead using the minimum outgoing magnitude according to SP. In this algorithm, if the decoder computes the outgoing magnitudes according to SP, the maximum outgoing magnitude retains its values and all other outgoing magnitudes may be replaced with the minimum outgoing SP magnitude. This provides a performance quite close to SP in a very wide range of cases.

One remaining issue with this technique, however, is that the function U remains somewhat difficult to compute. Thus, aspects of the present disclosure propose a new decoder that is based on the above ideas on which two messages are used for all the outgoing messages. Additionally, aspects of the present disclosure propose a new, highly-accurate approximation of the function $U(A,B)$ (e.g., implemented at a processing node) that may be used as one of the components of the new check node update. Additionally, the new approximation of the function $U(A,B)$ allows the decoder to be used for both LDPC and Turbo codes.

FIG. 9 illustrates example operations 900 for wireless communication, for example, for decoding a codeword. According to certain aspects, operations 900 may be performed by a decoder (e.g., decoder 816) in a communications device (e.g., wireless device 302), such as a base station (e.g., eNB 102) and/or a user equipment (e.g., wireless node 116 and/or receiver system 250).

Operations 900 begin at 902 with receiving a codeword over a wireless channel. At 904, the wireless communications device receives, at a processing node of a decoder used to decode the codeword, a first incoming log likelihood ratio (LLR) and a second incoming LLR associated with the codeword. At 906, the wireless communications device approximates a processing node function and computes an output of the processing node function based, at least in part, on a magnitude of the first incoming LLR and a magnitude of the second incoming LLR. At 908, the wireless communications device decodes the codeword based, at least in part, on the output of the processing node function. Additionally, while not illustrated, operations 900 may, in some cases, also include applying the approximate processing node function to two incoming LLRs to generate an outgoing LLR magnitude. Further, in other cases, operations 900 may also include applying the approximate processing node function to two incoming LLRs to generate the output of the processing node function and then applying the approximate processing node function again with inputs to be the previous output and a third incoming LLR and so on so forth recursively. Further, operations 900 may include a storing maximum and a minimum (or second maximum) of the output as computed for the full processing node using the approximate processing node function.

Before developing the approximation of the function $U(A,B)$, aspects of the present disclosure will first discuss a technique often used in turbo decoder implementation of the function $F(A,B)$. The function $F(A,B)$ used in a turbo decoder is based on the identity $F(A,B)=\ln(e^A+e^B)=\max(A,B)+\ln(1+e^{-|A-B|})$. The function $f(x)=\ln(1+e^{-x})$ decays rapidly from ln(2) and can be conveniently implemented at the turbo decoder by using look-up tables and some additional simple logic. From an implementation perspective, this form of the function F(A,B) reduces complexity as the two argument function F may be largely reduced to the evaluation of the single argument function $f$ as $F(A,B)=\ln(e^A+e^B)=\max(A,B)+f(|A-B|)$.

Aspects of the present disclosure will now describe the approximation of the function U(A,B) for the proposed adjusted min-sum (AdjMS) decoding algorithm. First, recall the SP decoder check node update function. For example, given a pair of LLRmags, A and B, the check node update in the SP decoder can be generically written as:

$$U(A,B) = \ln\left(\coth\frac{\left(\ln\coth\frac{A}{2} + \ln\coth\frac{B}{2}\right)}{2}\right) = \min(A,B) - G(A,B),$$

where the function G(A,B) can be thought of as a correction term to the minimum LLRmag, min(A,B). In general, the function G(A,B) cannot be reduced to a function of a single argument, but good approximations of a single argument may be made. For example, for x not too small, for example larger than 1, then the function ln(cothx/2) is well approximated by $2^{-x}$.

As a consequence, it may be possible to obtain a fairly good approximation to the SP check node update, U(A,B), using the approximation $G(A,B) \approx f(|A-B|)$ to obtain $$\ln\left(\coth\frac{\left(\ln\coth\frac{A}{2} + \ln\coth\frac{B}{2}\right)}{2}\right) = U(A,B) \approx (\min(A,B) - f(|A-B|))^+,$$

where the '+' operation is given by $x^+=x$ if $x>0$ and $x^+=0$ if $x\le 0$. According to certain aspects, this approximation is quite good when A and B are fairly large and also when |A−B| is large; however, it is less accurate when both A and B are relatively small which may often be the case when transmitting at lower SNRs.

According to certain aspects, when this approximation of G(A,B) is used to approximate U(A,B) in an SP decoder, the resulting loss is typically small for high rate codes where LLRmag values, in general, are higher and somewhat worse for low rate codes where LLRmag values are generally smaller. Similarly, standard MS-like decoders such as OMS and NMS also typically perform reasonably well for high rate codes but not so well for low rate codes. Hence, the MS-like decoders mentioned previously tend to significantly underperform as compared to the SP decoder at low code rates.

According to certain aspects, a significantly better approximation of the U function, Û(A,B), may be obtained by letting M=min(A,B) and takes the form:

$$\ln\left(\coth\frac{\left(\ln\coth\frac{A}{2} + \ln\coth\frac{B}{2}\right)}{2}\right) =$$
$$U(A,B) \approx \hat{U}(A,B) = M - f(|A-B| + h(M))$$

Note that this approximation of Û(A,B), while a bit more complicated, involves two functions of a single argument, h and f.

According to aspects, the approximation Û(A,B), of the basic update function U(A,B), on two incoming LLRmags may be computed as follows. First, the minimum of A and B may be computed (e.g., min(A,B)), denoted by M. Then, from M a quantity is subtracted which is computed as follows. For example, the absolute value of the difference of the two incoming LLRmags is taken, |A−B|, and to that a correction term is applied. The correction term consists of a function h with a single argument which is applied to M. Finally, the function $f$ is applied to the quantity computed previously and is subtracted from M, as illustrated above.

According to aspects, the function h(x) may be defined as ln coth(x) or $-\ln(1-e^{-2x})$, or some value in between. According to aspects, it can be shown that by defining h as h(x)=ln (coth(x)), the error between the true SP update, U(A,B), and approximated update, Û(A,B), on two incoming LLRs is uniformly upper bounded by 0.03 with the approximation of the outgoing LLRmag being larger in practice.

According to aspects, the proposed functions of a single argument, h and f, may be implemented in some cases using two look-up tables, one for the function h and one for the function, $f$. According to aspects, the function h decays quickly, thus for values of M that are sufficiently large h may be set to 0. Typically, a look up table for h may be significantly smaller (e.g. half) then that for $f$ and therefore, the function h represents a relatively small increase in complexity.

As an example, the look-up table for $f$ may be given by [4,3,3,2,2,2,1,1,1,1,0,0,0,0,0,0] and the look-up table for h can be given by [15,10,6,4,3,2,1,1] when using a quantized AdjMS decoder with a quantization of log(2.0)/4.0. Then, two incoming LLRmags A and B may be represented by integer values A' and B' with the interpretation A=A' log (2.0)/4 and B=B' log(2.0)/4. According to aspects, a corresponding integer representation of h(min(A,B)), denoted h'(min(A',B')), may then be obtained by reading the h lookup table at location min(A',B') where if min(A',B')>7 then we take h(min(A,B))=0 and the function $f(|A-B|+h(M))$ may be evaluated by looking up the value at location |A'−B'|+h' (min(A',B')), where h'(min(A',B')) was computed in the previous lookup table step.

The second component of the adjusted minimum-sum decoding algorithm involves determining what two magnitudes to use for the outgoing LLRmags. As described above, good decoding performance may be obtained by using the maximum and minimum outgoing LLR magnitudes as determined by SP (e.g., the outgoing message corresponding to the SP LLRmag maximum may be set the LLRmag maximum and all other outgoing LLRmags may be set equal to the SP outgoing LLR minimum). Thus, aspects of the present disclosure propose to approximate the maximum and minimum outgoing LLR magnitudes using the approximation of U (e.g., Û(A,B)) given above.

For example, assuming a check node of degree at least two, the full check node magnitude update algorithm takes the following recursive form. First, internal magnitudes A, B, and R may be defined. Magnitudes A and B are respectively set to the minimum and maximum magnitudes in the first two incoming messages and R may be set to infinity$^+$. Then, for each subsequent incoming magnitude C (after the first two) the following steps are taken.

Set T=C
If C<A set A=C and T=A
If C>B set B=C and T=B
Update R=Û(R,T), where Û is given above According to aspects, an outgoing LLRmag given on the minimum-incoming edge (on which the magnitude A was incoming) may be given by $\hat{U}(R,B)$. Further, the outgoing magnitude given on the other edges is $\hat{U}(R,A)$. Some reduction in the number of applications of $\hat{U}$ can be obtained by noting that up to three messages can be used to determine A,B and R without application of $\hat{U}$. This reduction is useful for implementations in which the approximation $\hat{U}$ is computed in two cycles instead of in one. The magnitude update, as described above, involves a recursive update of R, where the next update depends on the current update. In implementations where one incoming message is processed in each clock cycle, it may be desirable to be able to perform the update, including evaluation of $\hat{U}$, in one clock cycle but this may not be feasible in some cases. If two clock cycles are required then some delay in the processing may be required but the implementation can exploit the fact that $\hat{U}$ need not be computed for each incoming message.

According to certain aspects, by approximating the function U as described above, the adjusted minimum-sum decoding algorithm may be used for both LDPC and Turbo codes, for example, by using different input values. For example, turbo decoding, the function f may be approximated by using the input in the form of |A−B| for magnitudes A and B (LLRmags or shifted log probabilities) and for LDPC decoding, the function U may be approximated by using an input in the form of |A−B|−h(min(A,B)).

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

In some cases, rather than actually transmitting a frame, a device may have an interface to output a frame for transmission. For example, a processor may output a frame, via a bus interface, to an RF front end for transmission. Similarly, rather than actually receiving a frame, a device may have an interface to obtain a frame received from another device. For example, a processor may obtain (or receive) a frame, via a bus interface, from an RF front end for transmission.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for encoding may include one or more processors, such as the TX data processor 214, TX MIMO processor 220, and/or the processor 270 of the base station 210 illustrated in FIG. 2; the TX data processor 238, Modulator 280, and/or the processor 270 of the wireless node 250 illustrated in FIG. 2; the transmitter 310, the DSP 320, and/or the processor 304 of the wireless device 302 illustrated in FIG. 3; and/or the encoder 602 of the encoder 600 illustrated in FIG. 6.

Means for decoding may include one or more processors, such as the RX data processor 242 and/or the processor 230 of the base station 210 illustrated in FIG. 2; the RX data processor 260 and/or the processor 270 of the wireless node 250 illustrated in FIG. 2; the receiver 312, the DSP 320, and/or the processor 304 of the wireless device 302 illustrated in FIG. 3; and/or the decoder 816 of the decoder 800 illustrated in FIG. 6.

Means for transmitting comprise a transmitter, which may include the TX data processor 214, TX MIMO processor 220, the transceiver(s) 222a-222t, and/or the antenna(s) 224a-224t of the base station 210 illustrated in FIG. 2; the TX data processor 238, the modulator 280, the transceiver(s) 252a-252r, and/or the antenna(s) 252a-252r of the wireless node 250 illustrated in FIG. 2; the transmitter 310 and/or the antenna(s) 316 of the wireless device 302 illustrated in FIG. 3; and/or the TX chain 714 and antenna 718 of the encoder 700 illustrated in FIG. 7.

Means for receiving comprise a receiver, which may include the RX data processor 242, demodulator 240, transceiver(s) 222a-222t, and/or the antenna(s) 224a-224t of the base station 210 illustrated in FIG. 2; the RX data processor 260, transceiver(s) 252a-252r, and/or the antenna(s) 252a-252r of the wireless node 250 illustrated in FIG. 2; the receiver 312 and/or the antenna(s) 316 of the wireless device 302 illustrated in FIG. 3; and/or the RF chain 804 and antenna 802 of the decoder 800 illustrated in FIG. 8.

Means for approximating, means for applying, means for determining, means for setting, and/or means for computing may comprise one or more processor, such as the RX data processor 242 and/or the processor 230 of the base station 210 illustrated in FIG. 2; the RX data processor 260 and/or the processor 270 of the wireless node 250 illustrated in FIG. 2; the receiver 312, the DSP 320, and/or the processor 304 of the wireless device 302 illustrated in FIG. 3; and/or the decoder 816 of the decoder 800 illustrated in FIG. 6.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer.

In the case of a wireless node (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a wireless node and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a wireless node and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for wireless communications by a wireless device, comprising:
  receiving, at a receiver, a codeword over a wireless channel;
  receiving, at a processing node of a decoder used to decode the codeword, a first incoming log likelihood ratio (LLR) and a second incoming LLR associated with the codeword;
  approximating a processing node function and computing an output of the processing node function based, at least in part, on a magnitude of the first incoming LLR and a magnitude of the second incoming LLR, wherein approximating the processing node function comprises:
    determining a minimum, M, of the magnitude of the first incoming LLR and the magnitude of the second incoming LLR;

computing a correction term according to:
  f(|A−B|+h(M)), where A is the first incoming LLR, B is the second incoming LLR, f is a first real function of one argument, and h is a second real function of one argument, wherein h is a non-increasing function that is non-zero for at least some input values; and
  determining the approximated processing node function by subtracting the correction term from M;
decoding the codeword based, at least in part, on the output of the processing node function; and
outputting the decoded codeword to a memory.

2. The method of claim 1, further comprising:
applying the approximated processing node function to the first incoming LLR and the second incoming LLR to generate the output of the processing node function, wherein the output comprises an outgoing LLR magnitude; or
applying the approximated processing node function to the first incoming LLR and the second incoming LLR to generate the output of the processing node function and then applying the approximated processing node function again with inputs corresponding to the output of the processing node function and a third incoming LLR.

3. The method of claim 2, wherein the codeword is encoded using a low-density parity-check code and the decoder comprises an LDPC decoder; and
further comprising:
  determining a first outgoing message and a second outgoing message to be stored based on the approximate processing node function; and
  decoding the codeword based further, at least in part, on the stored first message and the stored second message.

4. The method of claim 3, wherein determining the first outgoing message and the second outgoing message to be stored comprises:
setting the first outgoing message to be a maximum of the output as computed using the approximated processing node function; and
setting the second outgoing message to be either a minimum or a second maximum of the output computed using the approximated processing node function.

5. The method of claim 1, wherein the first real function of one argument comprises:
  $f(x)=\ln(1+e^{-x})$, where x is any non-negative real value.

6. The method of claim 1, wherein the codeword comprises a low-density parity-check (LDPC) encoded codeword and the second real function of one argument comprises:
  $h(x)=\ln(\coth(x))$ or $-\ln(1-e^{-2x})$ or some value in between, where x is any non-negative real value.

7. The method of claim 1, wherein the codeword comprises a Turbo code encoded codeword or a convolutional code encoded codeword and the second real function of one argument comprises:
  $h(x)=0$.

8. The method of claim 1, wherein the processing node function is based on quantized incoming LLR magnitudes, and wherein the second real function of one argument comprises:
  $h(x)=0$ for x larger than a pre-determined threshold.

9. An apparatus for wireless communications by a wireless device, comprising:
at least one processor configured to:
  receive a codeword over a wireless channel;
  receive, at a processing node of a decoder used to decode the codeword, a first incoming log likelihood ratio (LLR) and a second incoming LLR associated with the codeword;
  approximate a processing node function and computing an output of the processing node function based, at least in part, on a magnitude of the first incoming LLR and a magnitude of the second incoming LLR, wherein the at least one processor is configured to approximate the processing node function by:
    determining a minimum, M, of the magnitude of the first incoming LLR and the magnitude of the second incoming LLR;
    computing a correction term according to:
      f(|A−B|+h(M)), where A is the first incoming LLR, B is the second incoming LLR, f is a first real function of one argument, and h is a second real function of one argument, wherein h is a non-increasing function that is non-zero for at least some input values; and
    determining the approximated processing node function by subtracting the correction term from M; and
  decode the codeword based, at least in part, on the output of the processing node function; and
  output the decoded codeword to a memory coupled with the at least one processor.

10. The apparatus of claim 9, wherein the at least one processor is further configured to:
apply the approximated processing node function to the first incoming LLR and the second incoming LLR to generate the output of the processing node function, wherein the output comprises an outgoing LLR magnitude; or
apply the approximated processing node function to the first incoming LLR and the second incoming LLR to generate the output of the processing node function and then applying the approximated processing node function again with inputs corresponding to the output of the processing node function and a third incoming LLR.

11. The apparatus of claim 10, wherein the codeword is encoded using a low-density parity-check code and the decoder comprises an LDPC decoder; and
wherein the at least one processor is further configured to:
  determine a first outgoing message and a second outgoing message to be stored based on the approximated processing node function; and
  decode the codeword based further, at least in part, on the stored first message and the stored second message.

12. The apparatus of claim 11, wherein the at least one processor is configured to determine the first outgoing message and the second outgoing message to be stored by:
setting the first outgoing message to be a maximum of the output as computed using the approximated processing node function; and
setting the second outgoing message to be either a minimum or a second maximum of the output computed using the approximated processing node function.

13. The apparatus of claim 9, wherein the first real function of one argument comprises:
  $f(x)=\ln(1+e^{-x})$, where x is any non-negative real value.

14. The apparatus of claim 9, wherein the codeword comprises a low-density parity-check (LDPC) encoded codeword and the second real function of one argument comprises:

$h(x)=\ln(\coth(x))$ or $-\ln(1-e^{-2x})$ or some value in between, where x is any non-negative real value.

15. The apparatus of claim 9, wherein the codeword comprises a Turbo code encoded codeword or a convolutional code encoded codeword and the second real function of one argument comprises:

$h(x)=0$.

16. The apparatus of claim 9, wherein the processing node function is based on quantized incoming LLR magnitudes, and wherein the second real function of one argument comprises:

$h(x)=0$ for x larger than a pre-determined threshold.

17. An apparatus for wireless communications by a wireless device, comprising:

means for receiving a codeword over a wireless channel;

means for receiving, at a processing node of a decoder used to decode the codeword, a first incoming log likelihood ratio (LLR) and a second incoming LLR associated with the codeword;

means for approximating a processing node function and computing an output of the processing node function based, at least in part, on a magnitude of the first incoming LLR and a magnitude of the second incoming LLR, wherein the means for approximating the processing node function comprise:

means for determining a minimum, M, of the magnitude of the first incoming LLR and the magnitude of the second incoming LLR;

means for computing a correction term according to:

$f(|A-B|+h(M))$, where A is the first incoming LLR, B is the second incoming LLR, f is a first real function of one argument, and h is a second real function of one argument; and means for determining the approximated processing node function by subtracting the correction term from M;

means for decoding the codeword based, at least in part, on the output of the processing node function; and means for outputting the decoded codeword to a memory.

18. The apparatus of claim 17, further comprising:

means for applying the approximated processing node function to the first incoming LLR and the second incoming LLR to generate the output of the processing node function, wherein the output comprises an outgoing LLR magnitude; or means for applying the approximated processing node function to the first incoming LLR and the second incoming LLR to generate the output of the processing node function and then applying the approximated processing node function again with inputs corresponding to the output of the processing node function and a third incoming LLR.

19. The apparatus of claim 18, wherein the codeword is encoded using a low-density parity-check code and the decoder comprises an LDPC decoder; and further comprising:

means for determining a first outgoing message and a second outgoing message to be stored based on the approximated processing node function; and means for decoding the codeword based further, at least in part, on the stored first message and the stored second message.

20. The apparatus of claim 19, wherein the means for determining the first outgoing message and the second outgoing message to be stored comprises:

means for setting the first outgoing message to be a maximum of the output as computed using the approximated processing node function; and means for setting the second outgoing message to be either a minimum or a second maximum of the output computed using the approximated processing node function.

21. The apparatus of claim 17, wherein the first real function of one argument comprises:

$f(x)=\ln(1+e^{-x})$, where x is any non-negative real value.

22. The apparatus of claim 17, wherein the codeword comprises a low-density parity-check (LDPC) encoded codeword and the second real function of one argument comprises:

$h(x)=\ln(\coth(x))$ or $-\ln(1-e^{-2x})$ or some value in between, where x is any non-negative real value.

23. The apparatus of claim 17, wherein the codeword comprises a Turbo code encoded codeword or a convolutional code encoded codeword and the second real function of one argument comprises:

$h(x)=0$.

24. The apparatus of claim 17, wherein the processing node function is based on quantized incoming LLR magnitudes, and wherein the second real function of one argument comprises:

$h(x)=0$ for x larger than a pre-determined threshold.

25. A non-transitory computer-readable medium for wireless communications by a wireless device, comprising:

instructions that, when executed by at least one processor, cause the at least one processor to:

receive a codeword over a wireless channel;

receive, at a processing node of a decoder used to decode the codeword, a first incoming log likelihood ratio (LLR) and a second incoming LLR associated with the codeword;

approximate a processing node function and computing an output of the processing node function based, at least in part, on a magnitude of the first incoming LLR and a magnitude of the second incoming LLR, wherein the instructions that cause the at least one processor to approximate the processing node function comprise instructions that further cause the at least one processor to:

determine a minimum, M, of the magnitude of the first incoming LLR and the magnitude of the second incoming LLR;

compute a correction term according to:

$f(|A-B|+h(M))$, where A is the first incoming LLR, B is the second incoming LLR, f is a first real function of one argument, and h is a second real function of one argument; and determine the approximated processing node function by subtracting the correction term from M;

decode the codeword based, at least in part, on the output of the processing node function; and output the decoded codeword to a memory.

26. The non-transitory computer-readable medium of claim 25, wherein:

the first real function of one argument comprises:

$f(x)=\ln(1+e^{-x})$, where x is any non-negative real value; and the codeword comprises a low-density parity-check (LDPC) encoded codeword and the second real function of one argument comprises:

$h(x)=\ln(\coth(x))$ or $-\ln(1-e^{-2x})$ or some value in between, where x is any non-negative real value; or
the codeword comprises a Turbo code encoded codeword or a convolutional code encoded codeword and the second real function of one argument comprises: $h(x)=0$.

* * * * *